(12) United States Patent
Hong et al.

(10) Patent No.: US 10,301,449 B2
(45) Date of Patent: May 28, 2019

(54) THERMOPLASTIC RESIN COMPOSITION HAVING EXCELLENT LIGHT STABILITY AT HIGH TEMPERATURE

(71) Applicant: Lotte Advanced Materials Co., Ltd., Yeosu-si (KR)

(72) Inventors: Sang Hyun Hong, Uiwang-si (KR); Tae Gon Kang, Uiwang-si (KR); Chan Moo Park, Uiwang-si (KR); Sang Hwa Lee, Uiwang-si (KR); Yoo Jin Jung, Uiwang-si (KR); Jong Cheol Lim, Uiwang-si (KR)

(73) Assignee: Lotte Advanced Materials Co., Ltd., Yeosu-si (KR)

( * ) Notice: Subject to any disclaimer, the term of this patent is extended or adjusted under 35 U.S.C. 154(b) by 158 days.

(21) Appl. No.: 14/552,765

(22) Filed: Nov. 25, 2014

(65) Prior Publication Data

US 2015/0152241 A1    Jun. 4, 2015

(30) Foreign Application Priority Data

Nov. 29, 2013 (KR) .................. 10-2013-0147878
Oct. 14, 2014 (KR) .................. 10-2014-0138130

(51) Int. Cl.
*C08K 3/22* (2006.01)
*C08K 3/32* (2006.01)
*H01L 33/60* (2010.01)
*F21V 7/22* (2018.01)
*F21Y 115/10* (2016.01)

(52) U.S. Cl.
CPC ............ *C08K 3/32* (2013.01); *C08K 3/22* (2013.01); *C08K 2003/2241* (2013.01); *C08K 2003/324* (2013.01); *F21V 7/22* (2013.01); *F21Y 2115/10* (2016.08); *H01L 33/60* (2013.01)

(58) Field of Classification Search
CPC .................................. C08K 3/32; C08K 3/22
USPC ............................................................ 524/417
See application file for complete search history.

(56) References Cited

U.S. PATENT DOCUMENTS

| | | |
|---|---|---|
| 4,006,272 A | 2/1977 | Sakaguchi et al. |
| 4,027,073 A | 5/1977 | Clark |
| 4,034,013 A | 7/1977 | Lane |
| 4,045,514 A | 8/1977 | Iwahashi et al. |
| 4,139,600 A | 2/1979 | Rollmann et al. |
| 4,177,185 A | 12/1979 | Tacke et al. |
| 4,180,494 A | 12/1979 | Fromuth et al. |
| 4,185,044 A | 1/1980 | Tacke et al. |
| 4,287,315 A | 9/1981 | Meyer et al. |
| 4,303,772 A | 12/1981 | Novicky |
| 4,393,153 A | 7/1983 | Hepp |
| 4,400,333 A | 8/1983 | Neefe |
| 4,639,480 A | 1/1987 | Birum |
| 4,664,983 A | 5/1987 | Nakamura et al. |
| 4,694,031 A | 9/1987 | Morita et al. |
| 4,745,029 A | 5/1988 | Kambour |
| 4,753,980 A | 6/1988 | Deyrup |
| 4,788,251 A | 11/1988 | Brown et al. |
| 4,803,235 A | 2/1989 | Okada |
| 4,900,610 A | 2/1990 | Hochberg et al. |
| 4,906,202 A | 3/1990 | Germ |
| 4,906,696 A | 3/1990 | Fischer et al. |
| 4,990,549 A | 2/1991 | Delvin et al. |
| 5,025,066 A | 6/1991 | DeRudder et al. |
| 5,061,558 A | 10/1991 | Fischer et al. |
| 5,068,285 A | 11/1991 | Laughner |
| 5,124,402 A | 6/1992 | Laughner et al. |
| 5,189,091 A | 2/1993 | Laughner |
| 5,200,492 A | 4/1993 | Ohnaga et al. |
| 5,219,915 A | 6/1993 | McKee et al. |
| 5,242,967 A | 9/1993 | Minnick |
| 5,256,718 A | 10/1993 | Yamamoto et al. |
| 5,280,070 A | 1/1994 | Drzewinski et al. |
| 5,284,916 A | 2/1994 | Drzewinski |
| 5,292,809 A | 3/1994 | Drzewinski et al. |
| 5,308,894 A | 5/1994 | Laughner |
| 5,369,154 A | 11/1994 | Laughner |
| 5,382,628 A | 1/1995 | Stewart et al. |
| 5,441,997 A | 8/1995 | Walsh et al. |
| 5,449,557 A | 9/1995 | Liebler et al. |
| 5,470,658 A | 11/1995 | Gasca et al. |
| 5,529,716 A | 6/1996 | Nomura et al. |
| 5,841,088 A * | 11/1998 | Yamaguchi ............ H01H 9/302 218/158 |
| 5,849,380 A | 12/1998 | Kashiba et al. |
| 5,863,974 A | 1/1999 | Tjahjadi et al. |
| 6,060,538 A | 5/2000 | Gallucci |

(Continued)

FOREIGN PATENT DOCUMENTS

| CN | 1285858 A | 2/2001 |
|---|---|---|
| CN | 1376182 A | 10/2002 |

(Continued)

OTHER PUBLICATIONS

Full Translation of Higuchi et al. JP 2007-218980, pp. 1-32.
Wypych, "2.1.67 Wollastonite," Handbook of Fillers, 3d Ed., pp. 151-152, Toronto, Ontario: ChemTec Publishing (2010).
English-translation of Abstract for Korean Publication No. 1998-055579, published Sep. 25, 1998, pp. 1
IERANOX 1076, SpecialChem, Ciba, now part of BASF, 2012 Retrieved online <http://www.specialchem4adhesives.com>, pp. 1

(Continued)

*Primary Examiner* — Kelechi C Egwim
(74) *Attorney, Agent, or Firm* — Additon, Higgins & Pendleton, P.A.

(57) ABSTRACT

A thermoplastic resin composition that can have high reflectance and light efficiency and excellent discoloration resistance even at high temperature and high humidity conditions over a long period of time includes (A) a polyester resin; (B) a white pigment; and (C) a sodium phosphate salt.

21 Claims, No Drawings

(56) References Cited

U.S. PATENT DOCUMENTS

| | | |
|---|---|---|
| 6,238,732 B1 | 5/2001 | Cameron et al. |
| 6,252,002 B1 | 6/2001 | Yamada et al. |
| 6,277,905 B1 | 8/2001 | Keep |
| 6,310,129 B1 | 10/2001 | Lilly et al. |
| 6,486,251 B1 | 11/2002 | Patel |
| 6,506,830 B1 | 1/2003 | Bussi et al. |
| 6,545,089 B1 | 4/2003 | DeRudder et al. |
| 6,646,068 B2 | 11/2003 | Chisholm et al. |
| 6,653,391 B1 | 11/2003 | Weber et al. |
| 7,009,029 B2 | 3/2006 | Oka et al. |
| 7,294,659 B2 | 11/2007 | Yatake |
| 7,385,013 B2 | 6/2008 | Kobayashi et al. |
| 7,671,143 B2 | 3/2010 | Lee et al. |
| 7,732,515 B2 | 6/2010 | Jang et al. |
| 7,960,464 B2 | 6/2011 | Kobayashi et al. |
| 8,044,134 B2 | 10/2011 | Chung et al. |
| 8,044,143 B2 | 10/2011 | Park et al. |
| 8,178,608 B2 | 5/2012 | Nakamura et al. |
| 8,304,481 B2 | 11/2012 | Nakamura et al. |
| 8,426,549 B2 | 4/2013 | Ogasawara |
| 8,815,993 B2 | 8/2014 | Kim et al. |
| 8,933,158 B2 | 1/2015 | Shiobara et al. |
| 9,018,296 B2 * | 4/2015 | Lee .......................... C08L 77/06 524/414 |
| 9,062,198 B2 | 6/2015 | Lu |
| 9,187,621 B2 | 11/2015 | Lu |
| 9,437,790 B2 | 9/2016 | Kim et al. |
| 2002/0042483 A1 | 4/2002 | Vanderbilt |
| 2002/0111409 A1 | 8/2002 | Talibuddin |
| 2003/0032725 A1 | 2/2003 | Gaggar et al. |
| 2004/0102604 A1 | 5/2004 | Bassler et al. |
| 2004/0175466 A1 | 9/2004 | Douglas et al. |
| 2005/0113532 A1 | 5/2005 | Fish, Jr. et al. |
| 2005/0159533 A1 | 7/2005 | Nabeshima et al. |
| 2005/0165207 A1 | 7/2005 | Agarwal et al. |
| 2005/0239949 A1 | 10/2005 | Nakamura et al. |
| 2006/0004154 A1 | 1/2006 | DeRudder et al. |
| 2006/0030647 A1 | 2/2006 | Ebeling et al. |
| 2006/0051587 A1 | 3/2006 | Mori et al. |
| 2006/0100307 A1 | 5/2006 | Uerz et al. |
| 2006/0135690 A1 | 6/2006 | Juikar et al. |
| 2007/0155913 A1 | 7/2007 | Chakravarti et al. |
| 2007/0161741 A1 | 7/2007 | Ogasawara |
| 2007/0213458 A1 * | 9/2007 | Topoulos ................ C08K 5/005 524/601 |
| 2007/0265371 A1 | 11/2007 | Takahashi et al. |
| 2007/0282056 A1 | 12/2007 | Schellekens et al. |
| 2008/0009571 A1 | 1/2008 | Pixton et al. |
| 2008/0146718 A1 | 6/2008 | Gijsman et al. |
| 2008/0153954 A1 | 6/2008 | Arpin |
| 2008/0242789 A1 | 10/2008 | Zhu et al. |
| 2009/0069479 A1 | 3/2009 | Seki |
| 2009/0080079 A1 | 3/2009 | Kogure et al. |
| 2009/0118402 A1 | 5/2009 | Jang et al. |
| 2009/0143267 A1 | 6/2009 | Zhang et al. |
| 2009/0209696 A1 | 8/2009 | Lee et al. |
| 2009/0215934 A1 | 8/2009 | Nakamura et al. |
| 2009/0253847 A1 * | 10/2009 | Komatsu .................. C08K 3/22 524/430 |
| 2009/0275678 A1 | 11/2009 | Kumazawa et al. |
| 2010/0029855 A1 | 2/2010 | Matsuoka et al. |
| 2010/0113648 A1 | 5/2010 | Niessner et al. |
| 2010/0113656 A1 | 5/2010 | Saga |
| 2010/0152357 A1 | 6/2010 | Kwon et al. |
| 2010/0160529 A1 | 6/2010 | Lee et al. |
| 2010/0160532 A1 | 6/2010 | Park et al. |
| 2010/0168272 A1 | 7/2010 | Park et al. |
| 2010/0197827 A1 | 8/2010 | Kim et al. |
| 2010/0227957 A1 | 9/2010 | Fujii |
| 2010/0240831 A1 | 9/2010 | Kim et al. |
| 2010/0256288 A1 | 10/2010 | Kim et al. |
| 2011/0009524 A1 | 1/2011 | Kwon et al. |
| 2011/0021677 A1 | 1/2011 | Kwon et al. |
| 2011/0040019 A1 | 2/2011 | Kwon et al. |
| 2011/0160380 A1 | 6/2011 | Kwon et al. |
| 2011/0310622 A1 | 12/2011 | Topoulos |
| 2012/0065318 A1 | 3/2012 | Park et al. |
| 2012/0129989 A1 | 5/2012 | Kim et al. |
| 2012/0165448 A1 | 6/2012 | Lee et al. |
| 2012/0264868 A1 * | 10/2012 | Lu ........................... C08L 27/18 524/430 |
| 2012/0264871 A1 | 10/2012 | Moon et al. |
| 2012/0305287 A1 | 12/2012 | Ni |
| 2012/0329938 A1 * | 12/2012 | Kim ..................... C08K 3/0033 524/494 |
| 2013/0005875 A1 | 1/2013 | Shoji et al. |
| 2013/0158184 A1 | 6/2013 | Topoulos |
| 2013/0172453 A1 | 7/2013 | Lee et al. |
| 2013/0217830 A1 | 8/2013 | Crawford et al. |
| 2013/0281587 A1 * | 10/2013 | Shim ................... C08K 3/0033 524/127 |
| 2014/0167088 A1 | 6/2014 | Lu |
| 2014/0167091 A1 | 6/2014 | Ogasawara et al. |
| 2014/0187662 A1 | 7/2014 | Lee et al. |
| 2014/0187700 A1 | 7/2014 | Lee et al. |
| 2014/0309356 A1 | 10/2014 | Kim et al. |
| 2014/0350163 A1 | 11/2014 | Ho et al. |
| 2017/0037240 A1 | 2/2017 | Kim et al. |

FOREIGN PATENT DOCUMENTS

| | | |
|---|---|---|
| CN | 101550282 A | 10/2009 |
| CN | 101560325 A | 10/2009 |
| CN | 101597423 A | 12/2009 |
| CN | 101747602 A | 6/2010 |
| CN | 102725349 A | 10/2012 |
| CN | 102838849 A | 12/2012 |
| CN | 103270114 A | 8/2013 |
| CN | 103910979 A | 7/2014 |
| CN | 103911000 A | 7/2014 |
| DE | 19845317 A1 | 4/2000 |
| DE | 69829099 T2 | 12/2005 |
| DE | 10 2013 226 703 A1 | 7/2014 |
| EP | 0033393 A2 | 8/1981 |
| EP | 0114288 A2 | 8/1984 |
| EP | 0180417 A2 | 5/1986 |
| EP | 0246620 A2 | 5/1987 |
| EP | 0376616 A2 | 7/1990 |
| EP | 0528462 A1 | 2/1993 |
| EP | 0787769 A2 | 8/1997 |
| EP | 1010725 A2 | 6/2000 |
| EP | 1147812 A1 | 10/2001 |
| EP | 2204412 A1 | 7/2010 |
| JP | 53-134799 A | 11/1978 |
| JP | 57-125241 A | 8/1982 |
| JP | 58-196250 A | 11/1983 |
| JP | 62-268612 A | 11/1987 |
| JP | 04-023856 A | 1/1992 |
| JP | 04-359954 A | 12/1992 |
| JP | 05-005055 | 1/1993 |
| JP | 05-098136 A | 4/1993 |
| JP | 05-125260 A | 5/1993 |
| JP | 05-194829 | 8/1993 |
| JP | 06-122771 A | 5/1994 |
| JP | 06-136212 A | 5/1994 |
| JP | 1994-200132 | 7/1994 |
| JP | 06-313089 A | 11/1994 |
| JP | 07-026101 | 1/1995 |
| JP | 1995-228776 | 8/1995 |
| JP | 10-060241 A | 3/1998 |
| JP | 10-060242 A | 3/1998 |
| JP | 10-219026 A | 8/1998 |
| JP | 11-129246 A | 5/1999 |
| JP | 11-171984 A | 6/1999 |
| JP | 11-181168 A | 7/1999 |
| JP | 11-279385 | 10/1999 |
| JP | 2000-063641 A | 2/2000 |
| JP | 2000-204244 A | 7/2000 |
| JP | 2000-264959 A | 9/2000 |
| JP | 2000-265001 A | 9/2000 |
| JP | 2000-327992 | 11/2000 |
| JP | 2001-049072 A | 2/2001 |
| JP | 2002-001125 A | 1/2002 |
| JP | 2002-080676 A | 3/2002 |

(56) References Cited

FOREIGN PATENT DOCUMENTS

| | | |
|---|---|---|
| JP | 2002-201344 A | 7/2002 |
| JP | 2002-294070 A | 10/2002 |
| JP | 2003-525335 | 8/2003 |
| JP | 2003-313392 | 11/2003 |
| JP | 2004-075994 A | 3/2004 |
| JP | 4325753 | 12/2004 |
| JP | 4915155 | 12/2004 |
| JP | 2005-097462 A | 4/2005 |
| JP | 2005-220173 A | 8/2005 |
| JP | 2006-249292 A | 9/2006 |
| JP | 2006-257284 A | 9/2006 |
| JP | 2006-342246 A | 12/2006 |
| JP | 2007-077222 | 3/2007 |
| JP | 2007-084952 A | 4/2007 |
| JP | 2007-218980 | 8/2007 |
| JP | 2008-013702 A | 1/2008 |
| JP | 2008-505233 A | 2/2008 |
| JP | 2009-507990 A | 2/2009 |
| JP | 2009-173015 A | 8/2009 |
| JP | 2009-263640 A | 11/2009 |
| JP | 2011-094026 A | 5/2011 |
| JP | 2013-251510 A | 12/2013 |
| JP | 2014-148615 A | 8/2014 |
| KR | 10-1999-0018287 | 3/1993 |
| KR | 1996-0007611 B1 | 6/1996 |
| KR | 10-1998-0004915 | 6/1998 |
| KR | 10-1998-027070 | 7/1998 |
| KR | 1998-055579 | 9/1998 |
| KR | 10-1999-0029495 A | 4/1999 |
| KR | 10-1999-0054644 | 7/1999 |
| KR | 10-2000-0038719 A | 7/2000 |
| KR | 10-2000-0048033 A | 7/2000 |
| KR | 10-2001-0032100 A | 4/2001 |
| KR | 10-2001-0070975 A | 7/2001 |
| KR | 2004-0079118 A | 9/2004 |
| KR | 10-2005-0032100 A | 4/2005 |
| KR | 10-0514272 B | 9/2005 |
| KR | 10-2005-0109049 A | 11/2005 |
| KR | 10-0581437 B | 5/2006 |
| KR | 10-2006-0135649 A | 12/2006 |
| KR | 10-0709878 B1 | 4/2007 |
| KR | 10-2007-0070686 A | 7/2007 |
| KR | 10-2007-0072372 A | 7/2007 |
| KR | 10-2007-0072375 A | 7/2007 |
| KR | 10-2007-0093994 A | 9/2007 |
| KR | 10-0767428 A1 | 10/2007 |
| KR | 2007-7026437 A | 12/2007 |
| KR | 10-2008-0062975 A | 7/2008 |
| KR | 10-2008-0063054 A | 7/2008 |
| KR | 10-0871436 B1 | 11/2008 |
| KR | 10-2009-0030511 A | 3/2009 |
| KR | 10-0886348 B1 | 3/2009 |
| KR | 10-2010-0071715 | 6/2010 |
| KR | 10-2011-0078044 A | 7/2011 |
| KR | 10-2012-0066740 A | 6/2012 |
| KR | 10-2012-0140332 A | 12/2012 |
| KR | 10-2013-0076027 A | 7/2013 |
| KR | 10-2013-0076733 A | 7/2013 |
| KR | 2013-0076733 A | 7/2013 |
| KR | 20130076733 A * | 7/2013 ............ C08L 67/02 |
| KR | 10-2013-0116813 A | 10/2013 |
| KR | 10-2014-0075517 A | 6/2014 |
| TW | 201306319 A | 2/2013 |
| TW | 201343743 A | 11/2013 |
| TW | 201343777 A | 11/2013 |
| WO | 02/088044 A1 | 11/2002 |
| WO | 2003/085029 A1 | 10/2003 |
| WO | 2005/075554 A1 | 8/2005 |
| WO | 2007/119920 A1 | 10/2007 |
| WO | 2007/140101 A1 | 12/2007 |
| WO | 2008/039017 A1 | 4/2008 |
| WO | 2008/081791 A1 | 7/2008 |
| WO | 2009/078593 A1 | 6/2009 |
| WO | 2009/078602 A1 | 6/2009 |
| WO | 2009/113762 A2 | 9/2009 |
| WO | 2009/116722 A1 | 9/2009 |
| WO | 2009/128601 A1 | 10/2009 |
| WO | 2010/143796 A1 | 12/2010 |
| WO | 2011/013882 A1 | 2/2011 |
| WO | 2012/081801 A1 | 6/2012 |
| WO | 2013/100578 A1 | 7/2013 |
| WO | 2013/101277 A1 | 7/2013 |
| WO | 2013125453 A | 8/2013 |
| WO | 2013/129201 A1 | 9/2013 |
| WO | 2015/102177 A1 | 7/2015 |

OTHER PUBLICATIONS

English translation of Chinese Office Action in commonly owned Chinese Application No. 200910211954 dated Jun. 23, 2011, pp. 1-5.

Trizky et al., "Correlation and Prediction of the Refractive Indices of Polymers by QSPR", Journal of Chemical Information and Computer Sciences, pp. 1171-1176, (1998)

Xu, "Predicition of Refractive Indices of Linear Polymers by a four-descriptor QSPR model", Polymer, 45 (2004) pp. 3651-8659.

Full English Translation of JP 04-359953, pp. 1-10.

Full English Translation of JP 04-359954, pp. 1-8.

Poly(cyclohexanedimethylene terephthalate), pp. 1-2, obtained online from http://www.polymerprocessing.com/polymers/PCT.html. No publication date given.

Turner et al., "Cyclohexanedimethanol Polyesters", 2001, pp. 127-134.

Devaney, R., "The structure and electrical properties of poly(1,4-cyclohexylenedimethylene terephthalate), a new linear thermoplastic polyester," National Academy of Sciences-National Research Council, vol. 1080, pp. 32-35 (Year 1963).

* cited by examiner

THERMOPLASTIC RESIN COMPOSITION HAVING EXCELLENT LIGHT STABILITY AT HIGH TEMPERATURE

CROSS-REFERENCE TO RELATED APPLICATIONS

This application claims priority under 35 U.S.C. § 119 to Korean Patent Application No. 10-2013-0147878, filed on Nov. 29, 2013, and Korean Patent Application No. 10-2014-0138130, filed on Oct. 14, 2014, in the Korean Intellectual Property Office, the disclosure of each of which is incorporated herein by reference in its entirety.

FIELD OF THE INVENTION

The following disclosure relates to a thermoplastic resin composition that can have excellent light stability and/or reliability under high temperature and high humidity conditions over a long period of time.

BACKGROUND

Recently, novel light sources such as light emitting diodes (LEDs) and organic light emitting diodes (OLEDs) have received attention as illuminating display devices while rapidly replacing existing light sources. The illuminating display devices include parts such as a reflector, a reflector cup, a scrambler, a housing, and the like. The material used in the manufacture of the parts as described above should be resistant against a high temperature for a long period of time and also minimize reflectance and whiteness deterioration caused by yellowing.

Polyesters, as well as copolymers and/or mixtures thereof, can have useful properties such as heat resistance, impact resistance, moldability, and the like, such that they are variously applied as an interior/exterior material. Polyester resin has also been used as a material for illuminating display devices. For example, a high heat resistant polyester resin is not deformed at a high temperature and has excellent discoloration resistance, such that the high heat resistant polyester resin has been used as a part of the LED for light efficiency. However, when the high heat resistant polyester resin is exposed to high temperature and high humidity conditions for a long period of time, it is difficult to maintain reflectance and discoloration resistance, such that long term light stability and reliability may be deteriorated.

A polyamide based resin composition having excellent heat resistance and reflectance by mixing an additive such as a light stabilizer, or the like, in order to improve light stability and discoloration resistance of a resin has been disclosed in U.S. Pat. No. 7,009,029. However, in this case, mechanical properties may be deteriorated by the additive, and it may be impossible to secure long term light stability and reliability.

Therefore, there is a need for a thermoplastic resin that can be used in the manufacture of illuminating display devices and can be exposed to high temperature and high humidity conditions for a long period of time.

SUMMARY

An embodiment of the present invention is directed to providing a thermoplastic resin composition capable of implementing excellent reflectance and light efficiency while being stable at a high temperature.

In addition, another embodiment of the present invention is directed to providing a thermoplastic resin composition capable of maintaining high reflectance and light efficiency under a high temperature and high humidity condition for a long period of time and having excellent discoloration resistance.

Further, another embodiment of the present invention is directed to providing a thermoplastic resin composition capable of having excellent long term light stability and reliability in addition to moldability.

In exemplary embodiments, a thermoplastic resin composition that can have excellent light stability at a high temperature includes: (A) a polyester resin; (B) a white pigment; and (C) a sodium phosphate salt. In this case, the amount of sodium in the thermoplastic resin composition may be about 0.01 to about 3 wt %.

The thermoplastic resin composition may include the sodium phosphate salt (C) in an amount of about 0.1 to about 10 parts by weight based on about 100 parts by weight of a base resin including about 40 to about 90 wt % of the polyester resin (A) and about 10 to about 60 wt % of the white pigment (B).

The sodium phosphate salt (C) may be any one or a mixture of two or more selected from sodium pyrophosphate, sodium tripolyphosphate, sodium tetrapolyphosphate, sodium pentapolyphosphate, and sodium hexametaphosphate.

The sodium phosphate salt (C) may be sodium pyrophosphate and/or sodium hexametaphosphate.

The polyester resin (A) may be prepared by polycondensation of an aromatic dicarboxylic acid component and a diol component including an alicyclic diol.

The polyester resin (A) may have a melting point of about 200 to about 380° C. and can include a repeating unit represented by the following Chemical Formula 1:

[Chemical Formula 1]

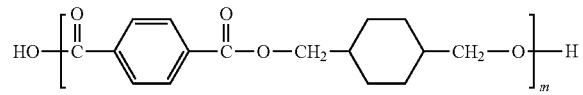

wherein in Chemical Formula 1, m is an integer of about 10 to 500.

The white pigment (B) may include any one or a mixture of two or more selected from titanium oxide, zinc oxide, zinc sulfide, white lead, zinc sulfate, barium sulfate, calcium carbonate, and aluminum oxide.

The thermoplastic resin composition may further include any one or two or more inorganic fillers (D) selected from carbon fiber, glass fiber, boron fiber, glass bead, glass flake, carbon black, talc, clay, kaolin, mica, calcium carbonate, wollastonite, potassium titanate whisker, aluminum borate whisker, zinc oxide whisker, and calcium whisker.

The inorganic filler (D) may be wollastonite.

The wollastonite may have an average length of about 0.1 to about 100 μm.

The thermoplastic resin composition may further contain any one or a mixture of two or more additives selected from a fluorescence brightening agent, a lubricant, a release agent, a nucleating agent, an antistatic agent, a stabilizer, a reinforcement agent, an inorganic additive, a pigment, and a dye.

In another embodiment, there is provided a molded product prepared from the thermoplastic resin composition as described above.

Initial reflectance measured at a wavelength of about 450 nm using a colorimeter may be about 90% or more, and a reflection decrease rate measured after exposure to a white light emitting diode (LED) light source at about 105° C. for about 500 hours may be less than about 30%.

The molded product may be a reflector for a light emitting device.

DETAILED DESCRIPTION

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

In addition, technical terms and scientific terms used in the present specification have the general meaning understood by those skilled in the art to which the present invention pertains unless otherwise defined, and a description for the known function and configuration obscuring the subject of the present invention will be omitted in the following description.

The present inventors studied in order to develop a thermoplastic resin composition capable of significantly improving long term light stability and reliability simultaneously with improving reflectance and light efficiency at a high temperature. As a result, the present inventors found that high reflectance and light efficiency as well as moldability at a high temperature and high humidity condition may be stably implemented for a long period of time by adding a sodium phosphate salt to a base resin including a polyester resin and a white pigment, thereby completing the present invention.

The thermoplastic resin composition according to the present invention may include (A) a polyester resin, (B) a white pigment, and (C) a sodium phosphate salt.

Hereinafter, each of the components will be described in more detail.

(A) Polyester Resin

In the present invention, the polyester resin may be used in order to improve heat resistance and mechanical properties at high temperatures generated during a manufacturing process of LED component materials, and the like. A resin needs to have a high melting point for heat resistance. Therefore, the polyester resin may have a melting point of about 200° C. or more, for example about 220 to about 380° C. and as another example, about 260 to about 320° C. When the melting point of the polyester resin is more than about 380° C. moldability may be deteriorated.

In the present invention, the polyester resin may have a structure including aromatic and alicyclic ring structures in a main chain. For example, the polyester resin may be prepared by polycondensation of an aromatic dicarboxylic acid component and a diol component including an alicyclic diol. In this case, a polymer includes a ring shaped structure, such that a high melting point may be obtained.

The dicarboxylic acid component may include one or more aromatic dicarboxylic acids and/or derivatives thereof. Examples of the dicarboxylic acid may include without limitation terephthalic acid, isophthalic acid, phthalic acid, naphthalene dicarboxylic acid, and the like, and mixtures thereof. In exemplary embodiments, terephthalic acid may be used.

As the diol component, an alicyclic diol may be used in order to allow the main chain to include a ring shaped repeating unit therein. As an example, 1,4-cyclohexanedimethanol (CHDM) may be used.

The diol component may further include an aliphatic diol in addition to the alicyclic diol such as 1,4-cyclohexanedimethanol. Examples of the aliphatic diol may include without limitation ethylene glycol, and the like, and mixtures thereof. When the diol component includes ethylene glycol, the diol component may include about 15 to about 100 wt % of 1,4-cyclohexanedimethanol and about 0 to about 85 wt % of ethylene glycol, for example, about 30 to about 80 wt % of 1,4-cyclohexanedimethanol and about 20 to about 70 wt % of ethylene glycol. The diol component including ethylene glycol may improve mechanical properties such as impact resistance, and the like, while not decreasing heat resistance of the polyester resin.

The diol component may further include one or more $C_6$ to $C_{21}$ aromatic diols and/or $C_3$ to $C_8$ aliphatic diols to modify the polyester resin. Examples of the $C_6$ to $C_{21}$ aromatic diol and/or $C_3$ to $C_8$ aliphatic diol may include without limitation propane-1,3-diol, butane-1,4-diol, pentane-1,5-diol, hexane-1,6-diol, 3-methylpentane-2,4-diol, 2-methylpentane-1,4-diol, 2,2,4-trimethylpentane-1,3-diol, 2-ethylhexane-1,3-diol, 2,2-diethylpropane-1,3-diol, 1,4-cyclobutane dimethanol, 2,2-bis-(3-hydroxyethoxyphenyl)-propane, 2,2-bis-(4-hydroxypropoxyphenyl)-propane, and the like, and mixtures thereof.

In the present invention, the polyester resin may include a repeating unit represented by the following Chemical Formula 1 by polycondensation of terephthalic acid and 1,4-cyclohexanedimethanol:

[Chemical Formula 1]

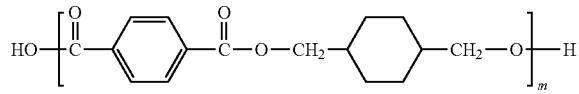

wherein in Chemical Formula 1, m is an integer of about 10 to 500.

In exemplary embodiments, the polyester resin may be a polycyclohexane dimethylene terephthalate (PCT) based resin.

In the present invention, the polyester resin may have an intrinsic viscosity [η] of about 0.4 to about 1.5 dl/g, for example, about 0.5 to about 1.2 dl/g, when measured in an o-chlorophenol solution at 35° C. When the intrinsic viscosity [η] is less than about 0.4 dl/g, the mechanical properties may be deteriorated, and when intrinsic viscosity [η] is more than about 1.5 dl/g, moldability may be deteriorated.

The polyester resin may be prepared by conventional polycondensation reactions known in the art. For example, the polycondensation reaction may include direct condensation of an acid by a transesterification reaction using a glycol or lower alkyl ester.

In the present invention, the polyester resin may be present in an amount of about 40 to about 90 wt % based on the entire weight (total weight, 100 wt %) of a base resin including the polyester resin (A) and the white pigment (B). In some embodiments, the base resin may include the polyester resin in an amount of about 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %.

Further, according to some embodiments of the present invention, the amount of the polyester resin can be in a range from about any of the foregoing amounts to about any other of the foregoing amounts.

When the amount of the polyester resin is less than about 40 wt %, heat resistance and mechanical properties of the thermoplastic resin composition may be deteriorated, and when the amount is more than about 90 wt %, moldability and light stability of the thermoplastic resin composition may be deteriorated.

(B) White Pigment

In the present invention, the white pigment may be used in order to increase whiteness and reflectance.

Examples of the white pigment may include without limitation titanium oxide, zinc oxide, zinc sulfide, white lead, zinc sulfate, barium sulfate, calcium carbonate, aluminum oxide, and the like, and mixtures thereof.

The white pigment may be treated with a coupling agent. Examples of the coupling agent may include without limitation silane coupling agents, titanium coupling agents, and the like, and mixtures thereof. For example, a white pigment surface-treated using a silane based compound such as vinyltriethoxysilane, 3-aminopropyltriethoxysilane, 3-glycidoxypropyltriethoxysilane, or the like, may be used.

In exemplary embodiments, titanium dioxide may be used as the white pigment. The titanium dioxide may be used in order to improve optical properties such as reflectance and a concealing property. The titanium dioxide may be conventional titanium dioxide, but is not limited thereto.

The titanium dioxide can be surface-treated with an inorganic and/or organic surface treating agent. Examples of the inorganic surface treating agent may include without limitation aluminum oxide (alumina, $Al_2O_3$), silicon dioxide (silica, $SiO_2$), zirconium dioxide (zirconia, $ZrO_2$), sodium silicate, aluminate, sodium aluminum silicate, zinc oxide, mica, and the like, and mixtures thereof. Examples of the organic surface treating agent may include without limitation polydimethylsiloxane, trimethylpropane (TMP), pentaerythritol, and the like, and mixtures thereof. The amount of the inorganic and/or organic surface treating agent at the time of surface treatment is not particularly limited but may be equal to or less than about 10 parts by weight based on about 100 parts by weight of titanium dioxide.

In exemplary embodiments, titanium dioxide coated with alumina ($Al_2O_3$) may be used. Titanium dioxide surface-treated with alumina may be further modified by an inorganic surface treating agent such as silicon dioxide, zirconium dioxide, sodium silicate, sodium aluminate, sodium aluminum silicate, mica, and the like, and mixtures thereof, and/or an organic surface treating agent such as polydimethylsiloxane, trimethylpropane (TMP), pentaerythritol, and the like, and mixtures thereof.

In the present invention, the white pigment may be present in an amount of about 10 to about 60 wt % based on the entire weight (total weight, 100 wt %) of the base resin including the polyester resin (A) and the white pigment (B). In some embodiments, the base resin may include the white pigment in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, or 60 wt %. Further, according to some embodiments of the present invention, the amount of the white pigment can be in a range from about any of the foregoing amounts to about any other of the foregoing amounts.

When the amount of the white pigment is less than about 10 wt %, reflectance and whiteness of the thermoplastic resin composition may be deteriorated, and when the amount is more than about 60 wt %, mechanical properties such as impact resistance of the thermoplastic resin composition may be deteriorated.

(C) Sodium Phosphate Salt

In the present invention, the sodium phosphate salt may be used in order to secure reflectivity, heat resistant stability, light stability, and discoloration resistance of the thermoplastic resin composition.

Since whiteness of the sodium phosphate salt itself is high, reflectivity of the resin composition may be secured. In addition, the sodium phosphate salt may effectively remove an acid that may be generated during a molding process using a thermoplastic resin composition. Therefore, heat resistant stability, light stability, discoloration resistance, and hydrolytic stability may be significantly increased by a combination of the sodium phosphate salt and other components.

The thermoplastic resin composition according to the present invention may include the sodium phosphate salt, and the entire (total) amount of sodium in the entire composition measured by an element measuring method may be in a range of about 0.01 to about 3 wt %, for example about 0.05 to about 2 wt %, and as another example, about 0.10 to about 1.5 wt %. In some embodiments, the thermoplastic resin composition may include sodium in an amount of about 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 1.5, 2, 2.5, or 3 wt %. Further, according to some embodiments of the present invention, the amount of sodium can be in a range from about any of the foregoing amounts to about any other of the foregoing amounts.

A content of sodium in the entire composition may be measured using a cation analysis. For example, after components in the composition are cationized, contents of the cationized components may be measured using a cation analysis apparatus.

When the amount of sodium in the entire composition is in the above-mentioned range, at the time of exposure to a high temperature and high humidity conditions for a long period of time, discoloration and/or deterioration of reflectance may be prevented, and long term light stability may be improved, thereby making it possible to secure reliability.

Examples of the sodium phosphate salt may include without limitation sodium pyrophosphate, sodium tripolyphosphate, sodium tetrapolyphosphate, sodium pentapolyphosphate, sodium hexametaphosphate, and the like, and combinations thereof.

In exemplary embodiments of the present invention, the sodium phosphate salt may include sodium pyrophosphate and/or sodium hexametaphosphate.

In the case of using the sodium phosphate salt as described above, even when a molded product prepared from the resin composition is exposed to a high temperature and high humidity condition for a long period of time, reflectance and/or light efficiency may not be deteriorated, and excellent light stability and/or discoloration resistance may be implemented.

Any general method known in the art may be used to make the sodium phosphate salt. In order to improve compatibility with the polyester resin and dispersibility in a matrix, a sodium phosphate salt surface-treated with a surface treating agent may be used.

Examples of the surface treating agent may include without limitation silane coupling agents, such as silane, epoxy silane, the like, titanium coupling agents, organic acids, polyols, silicons, and the like, and mixtures thereof.

In the present invention, the thermoplastic resin composition may include the sodium phosphate salt in an amount of about 0.1 to about 10 parts by weight, for example, about 0.1 to about 5 parts by weight, based on about 100 parts by weight of the base resin including the polyester resin (A) and the white pigment (B). In some embodiments, the thermoplastic resin composition may include the sodium phosphate salt in an amount of about 0.1, 0.2, 0.3, 0.4, 0.5, 0.6, 0.7, 0.8, 0.9, 1, 2, 3, 4, 5, 6, 7, 8, 9, or 10 parts by weight. Further, according to some embodiments of the present invention, the amount of the sodium phosphate salt can be in a range from about any of the foregoing amounts to about any other of the foregoing amounts.

When the amount of the sodium phosphate salt is less than about 0.1 parts by weight, reflectivity of the thermoplastic resin composition may be deteriorated, and when the amount is more than about 10 parts by weight, impact resistance and/or yellowing resistance of the thermoplastic resin composition may be deteriorated.

(D) Inorganic Filler

The thermoplastic resin composition according to the present invention may further include one or more inorganic fillers in order to improve mechanical properties, heat resistance, dimensional stability, and the like. The thermoplastic resin composition including the inorganic filler may improve heat resistance as well as mechanical properties such as tensile strength, bending strength, flexural modulus, and the like, of a molded product prepared from the thermoplastic resin composition.

As the inorganic filler, a general inorganic filler may be used.

Examples of the inorganic filler may include without limitation carbon fiber, glass fiber, boron fiber, glass bead, glass flake, carbon black, talc, clay, kaolin, mica, calcium carbonate, and the like, and mixtures thereof.

In addition, an acicular inorganic filler may be used. Examples of acicular inorganic filler may include without limitation wollastonite, potassium titanate whisker, aluminum borate whisker, zinc oxide whisker, calcium whisker, and the like, and mixtures thereof.

A surface of the inorganic filler may be modified in order to improve adhesion with the polyester resin.

At the time of applying the thermoplastic resin composition to a micro-forming field such as thin film formation, it is important to secure flowability.

The inorganic filler may have an average length of about 0.1 to about 100 μm, for example, about 0.1 to about 20 μm. When the length is in the above-mentioned range, excellent heat resistance, dimensional stability, and/or moldability may be implemented.

In the present invention, wollastonite may be used as the inorganic filler. In the case of using wollastonite in the micro-forming field such as formation of a thin film having a thickness of about 1 mm or less, excellent heat resistance, mechanical properties, and/or moldability of the thermoplastic resin composition may be secured.

In exemplary embodiments, wollastonite having a bulk density (tapped) of about 0.1 to about 2 $g/cm^3$, for example about 0.1 to about 1 $g/cm^3$ may be used. A cross section of the wollastonite may be changed depending on a special use purpose in addition to having a tetragonal shape. The wollastonite may be used without a particular limitation in the shape thereof.

The thermoplastic resin composition may include the inorganic filler in an amount of about 0.1 to about 40 wt % based on the entire weight (total weight, 100 wt %) of the base resin including the polyester resin (A) and the white pigment (B). In some embodiments, the thermoplastic resin composition may include the inorganic filler in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the inorganic filler can be in a range from about any of the foregoing amounts to about any other of the foregoing amounts.

When the amount of the inorganic filler is less than about 0.1 wt %, mechanical properties of the thermoplastic resin composition, such as impact strength, may be deteriorated, and at the time of molding the thermoplastic resin composition, a cooling rate of a molded product may be decreased, such that ejecting properties may be deteriorated. When the amount of the inorganic filler is more than about 40 wt %, the inorganic filler can protrude from a surface of the molded product prepared from the thermoplastic resin composition, such that an appearance of the molded product may be deteriorated. In addition, flowability of the thermoplastic resin composition may be deteriorated, such that moldability may be deteriorated, and since whiteness is lower than the white pigment, surface gloss of the molded product may also be deteriorated.

(E) Additive(s)

The composition may further include one or more additives according to the purpose in a range in which a desired effect of the present invention is not damaged. Examples of the additive may include without limitation antioxidants, antistatic agents, stabilizers, flame retardants, release agents, fluorescence brightening agents, plasticizers, lubricants, thickening agents, nucleating agents, reinforcement agents, inorganic additives, pigments, dyes, and the like, and mixtures thereof. The present invention is not limited thereto, and any general additive may be used.

Examples of the antioxidant may include without limitation phenols, amines, sulfurs, phosphorus, and the like, and mixtures thereof.

Examples of the heat stabilizer may include without limitation lactone compounds, hydroquinones, copper halides, iodine compound, and the like, and mixtures thereof.

Examples of the flame retardant may include without limitation bromine based flame retardants, chlorine based flame retardants, phosphorus based flame retardants, antimony based flame retardants, inorganic flame retardants, and the like, and mixtures thereof.

Examples of the fluorescence brightening agent may include without limitation stilbene-bis benzoxazole derivatives such as 4-(benzoxazole-2-yl)-4'-(5-methylbenzoxazole-2-yl)stilbene, 4,4'-bis(benzoxazole-2-yl)stilbene, and the like, and mixtures thereof.

Examples of the release agent may include without limitation polymers containing fluorine, silicon oils, metal salts of stearic acid, metal salts of montanic acid, ester waxes of montanic acid, polyethylene waxes, and the like, and mixtures thereof.

Examples of the nucleating agent may include without limitation talc, clay, and the like, and mixtures thereof.

The additive may be used in an amount of about 0.01 to about 20 parts by weight based on about 100 parts by weight of the base resin including the polyester resin (A) and the white pigment (B).

The present invention may provide a molded product prepared from the thermoplastic resin composition. As a method of preparing the molded product, a general method such as an extrusion molding method, an injection molding method, a hollow molding method, a compression molding method, a casting molding method, or the like, may be used.

Initial reflectance of the molded product prepared from the thermoplastic resin composition according to the present invention measured at a wavelength of about 450 nm using a colorimeter may be about 90% or more, for example about 92% or more. In addition, a reflectance decrease rate measured after exposing the molded product to white light emitting diode (LED) light at a temperature of about 105° C. for about 500 hours may be less than about 30%. Further, a reflectance decrease rate measured before and after exposing the molded product to white light emitting diode (LED) light at a temperature of about 85° C. and a relative humidity of about 85% for about 500 hours at a wavelength of about 450 nm may be less than about 20%.

In the thermoplastic resin composition according to the present invention, reflectivity and/or light efficiency may be improved by simultaneously using the pigment and the sodium phosphate salt and controlling the contents of the components. In addition, even though the thermoplastic resin composition is exposed to the high temperature and high humidity condition for a long period of time, reflectance and/or yellow index may not be deteriorated, and long term light stability and moldability can be excellent, such that the thermoplastic resin composition may be used as a material of a reflector for an LED continuously exposed to high temperature and high humidity environments.

The thermoplastic resin composition according to the present invention may be used in not only the reflector for the LED but also other applications for reflecting light. For example, the thermoplastic resin composition may be used in a reflector for a light emitting device such as various electric/electronic products, indoor lighting, outdoor lighting, automobile lighting, displays, and headlights, and the like.

Hereinafter, Examples will be provided in order to describe the present invention in more detail. However, the present invention is not limited to the following Examples.

Specifications of each of the components used in the following Examples and Comparative Examples are as follows.

(A1) Polyester Resin (PCT)
Puratan 0302 (SK Chemical) is used.
(A2) Aromatic Polyamide Resin (PA10T)
PA10T, which is an aromatic polyamide resin with an aromatic ring included in a main chain prepared by polycondensation of terephthalic acid and 1,10-decane diamine and having a melting point of about 315° C. is used.
(A3) Aromatic Polyamide Resin (PA6T/66)
PA6T/66, which is an aromatic polyamide resin with an aromatic ring included in a main chain prepared by polycondensation of terephthalic acid, adipic acid, and hexamethylene diamine and having a melting point of about 325° C. is used.
(B) White Pigment
Titanium dioxide ($TiO_2$, R-105 (DuPont)) is used.
(C1) Sodium Phosphate Salt Compound
Sodium pyrophosphate (Innophos) is used.
(C2) Sodium Phosphate Salt Compound
Sodium hexametaphosphate (Innophos) is used.
(D1) Inorganic Filler
Glass fiber 910 (Owens Corning) is used.
(D2) Inorganic Filler
Wollastonite (Nyglos 12 (NYCO), having an average length of about 18 μm and a bulk density of about 0.57 g/cm$^3$) is used.

EXAMPLE 1

A resin composition in a pellet state is prepared using the above-mentioned components in a composition shown in the following Table 1, by adding about 0.5 parts by weight of sodium pyrophosphate (C1) based on 100 parts by weight of a base resin including about 80 wt % of the polyester resin (A1) and about 20 wt % of the white pigment (B) and then melt-kneading the mixture in a twin-screw melting extruder heated to about 240 to 350° C. After the prepared pellet is dried at about 130° C. for about 5 hours or more, a test sample for evaluating physical properties having a size of about 90 mm×50 mm×2.5 mm is manufactured using a screw type injector heated to about 240 to 320° C.

EXAMPLE 2

A test sample is manufactured by the same method as in Example 1 except for using about 1.5 parts by weight of sodium pyrophosphate (C1) based on 100 parts by weight of the base resin.

EXAMPLE 3

A test sample is manufactured by the same method as in Example 1 except for using about 5 parts by weight of sodium pyrophosphate (C1) based on 100 parts by weight of the base resin.

EXAMPLE 4

A test sample is manufactured by the same method as in Example 1 except for using about 5 parts by weight of sodium hexametaphosphate (C2) based on 100 parts by weight of the base resin.

EXAMPLE 5

A test sample is manufactured by the same method as in Example 1 except for using a base resin including about 50 wt % of the polyester resin (A1), about 35 wt % of the white pigment (B), and about 15 wt % of the glass fiber (D1) and using about 5 parts by weight of sodium pyrophosphate (C1) based on 100 parts by weight of the base resin.

EXAMPLE 6

A test sample is manufactured by the same method as in Example 5 except for using about 5 parts by weight of sodium hexametaphosphate (C2) based on 100 parts by weight of the base resin.

EXAMPLE 7

A test sample is was manufactured by the same method as in Example 5 except for using wollastonite (D2) instead of the glass fiber (D1) in the base resin and using about 5 parts by weight of sodium pyrophosphate (C1) based on 100 parts by weight of the base resin.

EXAMPLE 8

A test sample is manufactured by the same method as in Example 1 except for using a base resin including about 40 wt % of the polyester resin (A1), about 45 wt % of the white pigment (B), and about 15 wt % of the glass fiber (D1) and using about 5 parts by weight of sodium pyrophosphate (C1) based on 100 parts by weight of the base resin.

COMPARATIVE EXAMPLE 1

A test sample is was manufactured by the same method as in Example 1 except for not including sodium pyrophosphate (C1).

COMPARATIVE EXAMPLE 2

A test sample is was manufactured by the same method as in Example 5 except for not including sodium pyrophosphate (C1).

COMPARATIVE EXAMPLE 3

A test sample is manufactured by the same method as in Example 5 except for using the aromatic polyamide (PA10T (A2)) instead of the polyester resin (A1).

COMPARATIVE EXAMPLE 4

A test sample is manufactured by the same method as in Example 5 except for using the aromatic polyamide (PA6T/66 (A3)) instead of the polyester resin (A1).

Measurement of Physical Properties

1) Reflectance

Reflectance is measured using a plate shaped test sample at a wavelength of 450 nm. After initial reflectance (SCI, specular component included) is measured, reflectance is measured after irradiation with an LED light source having a wavelength of about 450 nm for about 500 hours in a constant temperature and constant humidity oven at temperatures of about 105° C. and 85° C., respectively, and relative humidity of about 85%, thereby evaluating a decrease in reflectance. CM3500d (KONICA MINOLTA HOLDINGS, INC.) is used as a reflectometer.

2) Yellow Index

The yellow index of a test sample having a thickness of about 2.5 mm is measured using a Konica Minolta Corporation 3600D CIE Lab. Colorimeter according to ASTM D1925. An initial yellow index is measured, and the yellow index after the test sample is left in an oven at about 250° C. for about 5 minutes is measured, thereby evaluating a change in the yellow index.

3) Moldability: At the time of injection molding the resin composition at an injection temperature of about 300° C. and a mold temperature of about 130° C. using an about 75 ton injector based on a specific mold equipped with 48 cavities with a cup-shaped LED reflector structure (about 8 mm×1.5 mm×40 to 100 μm (length×width×wall thickness)), an appearance and moldability of the molded product are evaluated as follows:

Moldability (O): The molded product is cooled within a predetermined time (about 15 seconds), such that moldability is excellent.

Moldability (X): The resin composition is not molded, contraction, or a surface defect occurs.

4) Content of Sodium

After melting the molded product using nitric acid and hydrofluoric acid as solvents, a cont of sodium was measured using an inductive-coupled plasma optical emission spectrum (ICP-OES) apparatus.

TABLE 1

| Classification | Unit | Example 1 | 2 | 3 | 4 | 5 | 6 | 7 | 8 | Comparative Example 1 | 2 | 3 | 4 |
|---|---|---|---|---|---|---|---|---|---|---|---|---|---|
| (A1) PCT | wt % | 80 | 80 | 80 | 80 | 50 | 50 | 50 | 40 | 80 | 50 | — | — |
| (A2) PA10T | wt % | — | — | — | — | — | — | — | — | — | — | 50 | — |
| (A3) PA6T/66 | wt % | — | — | — | — | — | — | — | — | — | — | — | 50 |
| (B) TiO₂ | wt % | 20 | 20 | 20 | 20 | 35 | 35 | 35 | 45 | 20 | 35 | 35 | 35 |
| (C1) Sodium Pyrophosphate | Part by Weight | 0.5 | 1.5 | 5 | — | 5 | — | 5 | 5 | — | — | 5 | 5 |
| (C2) Sodium Hexametaphosphate | Part by Weight | — | — | — | 5 | — | 5 | — | — | — | — | — | — |
| (D1) Glass Fiber | Part by Weight | — | — | — | — | 15 | 15 | — | 15 | — | 15 | 15 | 15 |
| (D2) Wollastonite | Part by Weight | — | — | — | — | — | — | 15 | — | — | — | — | — |
| Content of Sodium in Entire Composition | wt % | 0.10 | 0.30 | 0.99 | 1.07 | 1.02 | 1.10 | 0.99 | 1.02 | 0 | 0.03 | 1.02 | 1.02 |
| Reflectance (%) Initial | | 94 | 94 | 93 | 93 | 92 | 92 | 91 | 93 | 93 | 91 | 90 | 89 |
| 105° C., 500 hr | | 81 | 84 | 86 | 82 | 83 | 80 | 89 | 90 | 65 | 61 | <50 | <50 |
| 85° C., 85%, 500 hr | | 88 | 90 | 91 | 85 | 90 | 87 | 91 | 90 | 75 | 71 | 83 | 75 |
| Yellow Index (YI) Initial | | 3.6 | 3.6 | 3.5 | 3.8 | 3.8 | 4.0 | 3.1 | 3.7 | 3.8 | 4.0 | 4.0 | 4.3 |
| 250° C., 5 min | | 3.9 | 3.8 | 3.6 | 4.1 | 4.5 | 5.1 | 3.8 | 4.2 | 5.5 | 5.9 | 6.5 | 9.3 |
| Difference in YI | | 0.3 | 0.2 | 0.1 | 0.3 | 0.7 | 0.9 | 0.7 | 0.5 | 1.7 | 1.9 | 2.5 | 5.0 |
| Moldability | | o | o | o | o | o | o | o | o | o | o | x | x |

As shown in Table 1, in Examples 1 to 8 according to the present invention, even after a long period of time, reflectance and a yellow index are not significantly decreased as compared to Comparative Examples 1 to 4. Particularly, in the Examples according to the present invention, a reflectance decrease rate is within about 20% even after a long period time at a high temperature of about 105° C., such that there is a significant difference in view of light stability at a high temperature, as compared to the Comparative Examples. Therefore, it may be confirmed that the thermoplastic resin composition according to the present invention may implement excellent discoloration resistance and light stability at a high temperature and high humidity condition for a long period of time, thereby making it possible to secure long term reliability.

The thermoplastic resin composition according to the present invention may be stable at a high temperature and implement high reflectance and light efficiency.

In addition, the thermoplastic resin composition according to the present invention may have excellent discoloration resistance while maintaining high reflectance and light efficiency even at a high temperature and high humidity condition for a long period of time.

Further, the thermoplastic resin composition according to the present invention may have excellent long term light stability and reliability.

Hereinabove, although the present invention is described by the exemplary embodiments, they are provided only for assisting in the entire understanding of the present invention. Therefore, the present invention is not limited to the exemplary embodiments. Various modifications and changes may be made by those skilled in the art to which the present invention pertains from this description.

Therefore, the spirit of the present invention should not be limited to the above-described embodiments, and the following claims as well as all modified equally or equivalently to the claims are intended to fall within the scope and spirit of the invention.

What is claimed is:

1. A thermoplastic resin composition that can have light stability at a high temperature comprising: (A) a polyester resin prepared by polycondensation of an aromatic dicarboxylic acid component and a diol component including an alicyclic diol; (B) a white pigment; and (C) a sodium phosphate salt, wherein the composition includes sodium in an amount of about 0.01 to about 3 wt % based on the total weight of the composition, wherein a molded product prepared from the composition has an initial reflectance measured at a wavelength of about 450 nm using a colorimeter of about 90% or more, and a reflection decrease rate measured after exposure to a white light emitting diode (LED) light source at 105° C. for 500 hours of less than about 30%.

2. The thermoplastic resin composition of claim 1, comprising the sodium phosphate salt (C) in an amount of about 0.1 to about 10 parts by weight based on about 100 parts by weight of a base resin including about 40 to about 90 wt % of the polyester resin (A) and about 10 to about 60 wt % of the white pigment.

3. The thermoplastic resin composition of claim 1, wherein the sodium phosphate salt (C) comprises sodium pyrophosphate, sodium tripolyphosphate, sodium tetrapolyphosphate, sodium pentapolyphosphate, sodium hexametaphosphate, or a mixture thereof.

4. The thermoplastic resin composition of claim 1, wherein the sodium phosphate salt (C) is sodium pyrophosphate and/or sodium hexametaphosphate.

5. The thermoplastic resin composition of claim 1, comprising sodium in an amount of about 0.05 to about 2 wt %.

6. The thermoplastic resin composition of claim 1, wherein the polyester resin (A) has a melting point of about 200 to about 380° C. and includes a repeating unit represented by the following Chemical Formula 1:

[Chemical Formula 1]

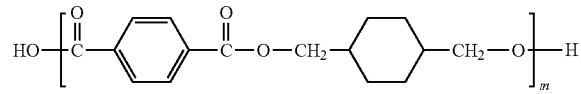

wherein in Chemical Formula 1, m is an integer of 10 to 500.

7. The thermoplastic resin composition of claim 1, wherein the white pigment (B) comprises titanium oxide, zinc oxide, zinc sulfide, white lead, zinc sulfate, barium sulfate, calcium carbonate, aluminum oxide, or a mixture thereof.

8. The thermoplastic resin composition of claim 1, further comprising inorganic filler (D) comprising carbon fiber, glass fiber, boron fiber, glass bead, glass flake, carbon black, talc, clay, kaolin, mica, calcium carbonate, wollastonite, potassium titanate whisker, aluminum borate whisker, zinc oxide whisker, calcium whisker, or a mixture thereof.

9. The thermoplastic resin composition of claim 8, wherein the inorganic filler (D) is wollastonite.

10. The thermoplastic resin composition of claim 8, wherein the inorganic filler (D) has an average length of about 0.1 to about 100 μm.

11. The thermoplastic resin composition of claim 1, further comprising an additive comprising an antioxidant, an antistatic agent, a stabilizer, a flame retardant, a release agent, a fluorescence brightening agent, a plasticizer, a lubricant, a thickening agent, a nucleating agent, a reinforcement agent, an inorganic additive, a pigment, a dye, or a mixture thereof.

12. A molded product prepared from the thermoplastic resin composition of claim 1.

13. The molded product of claim 12, having an initial reflectance measured at a wavelength of about 450 nm using a colorimeter of about 90% or more, and a reflection decrease rate measured after exposure to a white light emitting diode (LED) light source at 105° C. for 500 hours of less than about 30%.

14. The molded product of claim 12, wherein the molded product is a reflector for a light emitting device.

15. The thermoplastic resin composition of claim 1, wherein the white pigment (B) comprises titanium oxide, zinc oxide, zinc sulfide, white lead, zinc sulfate, barium sulfate, calcium carbonate, or a mixture thereof.

16. The thermoplastic resin composition of claim 1, wherein a molded product prepared from the composition exhibits an increase in an initial yellow index (YI) of 0.1 to 0.9 after exposure to 250° C. for 5 minutes as measured according to ASTM D1925.

17. A thermoplastic resin composition that can have light stability at a high temperature comprising:
a base resin comprising (A) about 40 to about 90wt % of a polyester resin prepared by polycondensation of an aromatic dicarboxylic acid component and a diol component including an alicyclic diol and (B) about 10 to about 60wt % of a white pigment; and (C) about 0.1 to about 10 parts by weight based on about 100 parts by weight of the base resin of a sodium phosphate salt, wherein the composition includes sodium in an amount of about 0.01 to about 3 wt % based on the total weight of the composition, and wherein a molded product prepared from the composition has an initial reflectance measured at a wavelength of about 450 nm using a colorimeter of about 90% or more, and a reflection decrease rate measured after exposure to a white light emitting diode (LED) light source at 105° C. for 500 hours of less than about 30%.

18. The thermoplastic resin composition of claim 17, wherein a molded product prepared from the composition exhibits an increase in an initial yellow index (YI) of 0.1 to 0.9 after exposure to 250° C. for 5 minutes as measured according to ASTM D1925.

19. The thermoplastic resin composition of claim 18, wherein:

the polyester resin (A) includes a repeating unit represented by the following Chemical Formula 1:

[Chemical Formula 1]

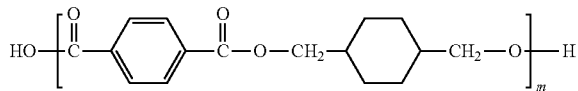

wherein in Chemical Formula 1, m is an integer of 10 to 500;

the white pigment (B) comprises titanium oxide, zinc oxide, zinc sulfide, white lead, zinc sulfate, barium sulfate, calcium carbonate, or a mixture thereof; and the sodium phosphate salt (C) is sodium pyrophosphate and/or sodium hexametaphosphate.

20. The thermoplastic resin composition of claim 19, comprising about 0.1 to about 5 parts by weight based on about 100 parts by weight of the base resin of the sodium phosphate salt (C), wherein the composition includes sodium in an amount of about 0.1 to about 1.5 wt % based on the total weight of the composition.

21. The thermoplastic resin composition of claim 20, wherein the molded product prepared from the composition has an initial reflectance measured at a wavelength of about 450 nm using a colorimeter of about 90% or more, and a reflection decrease rate measured after exposure to a white light emitting diode (LED) light source at 105° C. for 500 hours of less than about 20%.

* * * * *